(12) United States Patent
Kinstle, III (10) Patent No.: US 9,797,408 B2
(45) Date of Patent: Oct. 24, 2017

(54) BLOWER FAN COOLING SYSTEM

(71) Applicant: Corsair Memory, Inc., Fremont, CA (US)

(72) Inventor: Robert Michael Kinstle, III, Livermore, CA (US)

(*) Notice: Subject to any disclaimer, the term of this patent is extended or adjusted under 35 U.S.C. 154(b) by 31 days.

(21) Appl. No.: 14/952,837

(22) Filed: Nov. 25, 2015

(65) Prior Publication Data

US 2017/0146027 A1    May 25, 2017

(51) Int. Cl.
| | |
|---|---|
| H05K 7/20 | (2006.01) |
| F04D 29/44 | (2006.01) |
| F04D 29/42 | (2006.01) |
| H05K 1/02 | (2006.01) |
| F04D 29/58 | (2006.01) |
| G06F 1/20 | (2006.01) |

(52) U.S. Cl.
CPC ....... *F04D 29/441* (2013.01); *F04D 29/4226* (2013.01); *F04D 29/582* (2013.01); *G06F 1/20* (2013.01); *H05K 1/0203* (2013.01); *H05K 7/20145* (2013.01)

(58) Field of Classification Search
CPC . G06F 1/203; G06F 1/20; F28D 1/024; F04D 29/5813; F04D 29/4226; F04D 29/441; F04D 29/668; H05K 7/20145; H05K 7/20172; H05K 7/20218
See application file for complete search history.

(56) References Cited

U.S. PATENT DOCUMENTS 6,111,748 A * 8/2000 Bhatia ................... H01L 23/467
                                                                    165/122
2016/0290365 A1* 10/2016 Zhu ..................... F04D 29/4226

* cited by examiner

*Primary Examiner* — Robert J Hoffberg
*Assistant Examiner* — Hung Dang
(74) *Attorney, Agent, or Firm* — Carina M. Tan (57) ABSTRACT

A side-discharge blower fan unit with ductwork for controlling air flow is disclosed, according to certain embodiments.

6 Claims, 8 Drawing Sheets

BLOWER FAN COOLING SYSTEM

TECHNICAL FIELD

The present invention is directed to cooling systems for computers, and more specifically to aspects of blower fans used in conjunction with liquid coolers for small form factor computers with high performance hardware.

BRIEF DESCRIPTION OF THE DRAWINGS

For a better understanding of the various embodiments of the invention, reference should be made to the description of embodiments below, in conjunction with the following drawings in which like reference numerals refer to corresponding parts throughout the figures.

DETAILED DESCRIPTION

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well known to those of ordinary skill in the art are not described in detail to avoid obscuring aspects of the present invention.

According to certain embodiments, a blower fan unit is designed for use in small form factor computers that have high performance hardware.

According to certain embodiments, the blower fan unit is a side-discharge blower fan unit that includes ducting (ductwork) that is designed to distribute the rate of airflow more evenly across a heat transfer surface (e.g., an active cooling area of a radiator) into which the blower fan unit is discharging air. Such a blower fan unit allows for substantially uniform air flow through the radiator and also results in approximately 30% larger bulk total airflow through the radiator than would a blower fan unit that does not have such ducting.

A blower fan unit that does not have ductwork at its air discharge portion as described herein discharges air at different flow rates at different regions of the air discharge portion of the blower fan unit. For example, the first air discharge portion ("first discharge region") has high air output flow rate ("first air output flow rate"). The second air discharge portion ("second discharge region") has an air output flow rate ("second air output flow rate") that is lower than that of the first discharge region. The third air discharge portion ("third discharge region") has a lower air output flow rate ("third air output flow rate") than that of the second discharge region. For example, with no ductwork fins, the ratio of air output flow rate of the first, second and third discharge regions is approximately 480:250:180.

Thus, according to certain embodiments, the air discharge portion of the blower fan unit is configured with a set of fins (ductwork fins) in a manner so as to distribute the rate of airflow more evenly across a heat transfer surface (e.g., an active cooling area of a radiator). For example, the fins of the ductwork are positioned such that there are three ductwork inlet regions. In the first discharge region, the ductwork inlet comprises a small opening ("first ductwork inlet region"). In the second discharge region, the ductwork inlet comprises a larger opening ("second ductwork inlet region"). In the third discharge region, the ductwork inlet comprises a larger still opening ("third ductwork inlet region"), as described below with reference to the drawings herein.

The size ratio of the first ductwork inlet region to the second ductwork inlet region to the third ductwork inlet region is approximately in the range of 1.0:1.35:2.7 to 1.0:1.65:3.3, according to certain embodiments.

Further, according to certain embodiments, the configuration of ductwork fins as described above is such that there is a ductwork outlet region corresponding to each of the discharge regions described above. To explain, the set of fins form three ductwork inlet regions and three corresponding ductwork outlet regions (e.g., "first ductwork outlet region", "second ductwork outlet region", and "third ductwork outlet region").

According to certain embodiments, the size ratio of the first ductwork outlet region to the second ductwork outlet region to the third ductwork outlet region is approximately in the range of 1.0:1.0:1.0 to 1.0:1.11:1.25.

The ductwork configuration described above results in substantially uniform relative air output flow rate across the three ductwork outlet regions (the ratio of air output flow rates is approximately 450:435:420).

The embodiments are not limited to three sets of ductwork inlet regions and corresponding three sets of ductwork outlet regions. The number of fins that comprise the ductwork at the blower fan's air discharge region varies from implementation to implementation.

According to certain embodiments, the ductwork may comprise any number of fins from 3 fins to 10 fins, for example.

In other words, the number of fins is limited, in part, by the size of the blower fan's air discharge region, the size of the radiator's inlet region, and the objective of achieving substantially uniform air output flow rate across the ductwork outlet regions so that the airflow into radiator is substantially uniform across the whole inlet of the radiator.

To illustrate, assume that there are N number of fins, where N is a positive integer. The N fins are positioned in the blower fan unit to form a set of N air ducts such that the total air flow pressure at each of the N inlets of the N air ducts is approximately equal to one another, where, total air flow pressure=static air flow pressure+dynamic air flow pressure. Further, the N fins are shaped in a manner such that the outlets of the N air ducts are of approximately equal area.

According to certain embodiments, the blower fan unit is mounted to the PC (personal computer) motherboard using a small mounting frame. According to certain embodiments, such a mounting frame is designed to use standard mounting positions on the motherboard. According to certain embodiments, such a mounting frame has a height that raises the blower fan unit to at least a height that prevents the blower fan unit from contacting the top surface of the respective components on the motherboard. To explain, the mounting frame has a height that raises the blower fan unit to a height that prevents the blower fan unit from colliding with ay components on the motherboard.

According to certain embodiments, the air intake of the blower fan unit is a small distance directly above the motherboard such that the air flow transfers some heat away from the motherboard components, voltage regulator and chipset heatsinks, as the air is drawn from outside the computer chassis through an opening in the computer chassis and over the motherboard components, voltage regulator and chipset heatsinks, and then into the air intake of the blower fan unit. Thus, the blower fan unit is mounted at distance between approximately 40 millimeters to 50 millimeters above the motherboard, according to certain embodiments. According to certain embodiments, the blower fan unit is mounted at distance of approximately 45 millimeters above the motherboard.

According to certain embodiments, blower fan unit blows air towards an active cooling area of a radiator and away from the motherboard. The radiator is mounted inside the chassis of the PC. According to certain embodiments, the side-discharge blower fan unit is connected to an active cooling area of the radiator via a sealed ductwork frame of the blower fan unit such that the air that is discharged from the blower fan unit primarily flows over only the active cooling area of the radiator. By having the air flow primarily over only the active cooling area of the radiator, the radiator is more efficient at cooling.

According to certain embodiments, a water pump and cold plate of a closed loop liquid cooler removes heat from a CPU and or a GPU and the resulting hot liquid is carried to the radiator. According to certain embodiments, the liquid of the closed loop liquid cooler is water. As the hot liquid travels through the radiator, heat is removed from the liquid via the active cooling area of the radiator, which is in turn cooled by the air discharged from the blower fan unit. The resulting hot air exits via the radiator's exhaust. According to certain embodiments, the radiator's exhaust is located against an outer wall of the PC chassis such that the hot air can exit the computer chassis through an opening in the computer chassis wall.

According to certain embodiments, the blower fan unit includes (optional) vibration dampening components that dampens the vibration of the blower fan when the blower fan is running.

Figure 1:
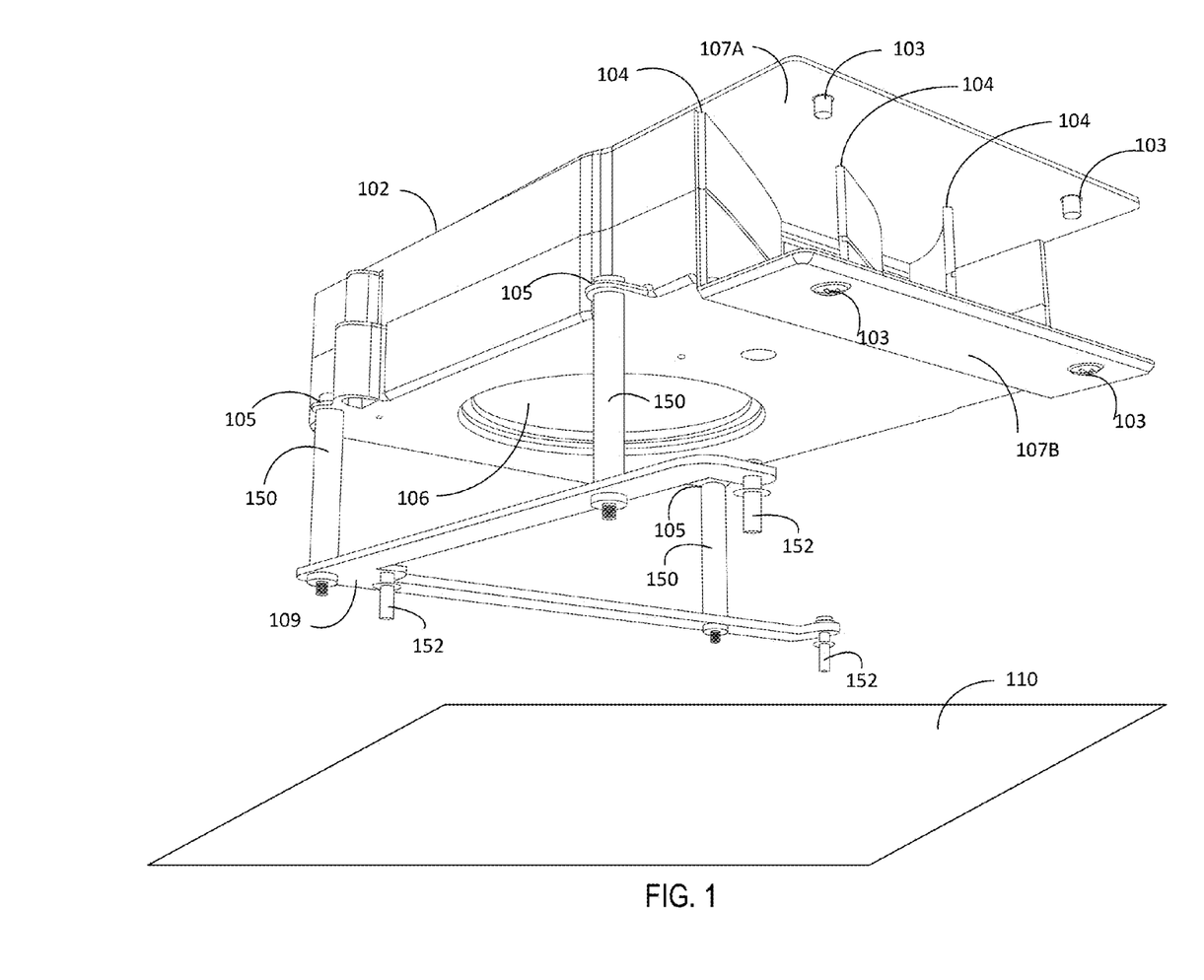
FIG. 1 illustrates a bottom perspective view of a side-discharge blower fan unit with mounting frame, according to certain embodiments.

FIG. 1 illustrates a bottom perspective view of a side-discharge blower fan unit with mounting frame, according to certain embodiments. FIG. 1 shows blower fan unit 102 and a mounting system 109. Blower fan unit 102 comprises ductwork. FIG. 1 shows the fins 104 of the ductwork and an air intake 106 through which air is pulled into the blower fan's ductwork. Mounting system 109 is used for mounting fan blower unit 102 to a motherboard 110 installed in the PC chassis. Mounting system 109 includes mounting struts 150 (that fit mounting holes 105 on the blower fan unit 102) and thumbscrews 152. Mounting system 109 is used for mounting blower fan unit 102 (using thumbscrews 152, for example) to a motherboard 110 that is installed in the PC chassis. The mounting system is for mounting the blower fan unit directly over the motherboard. The mounting system is described in further detail herein with reference with FIG. 3. Blower fan unit 102 also includes a top lip 107a covering the top of the ductwork and a bottom lip 107b covering the bottom of the ductwork. Blower fan unit further includes an attachment system 103 (e.g., screw holes and associated screws) on top lip 107a and bottom lip 107b for attaching the blower fan unit 102 to a radiator. Thus, fins 104 together with top and bottom lips (107a, 107b) form a set of air ducts for channeling air.

Figure 2:
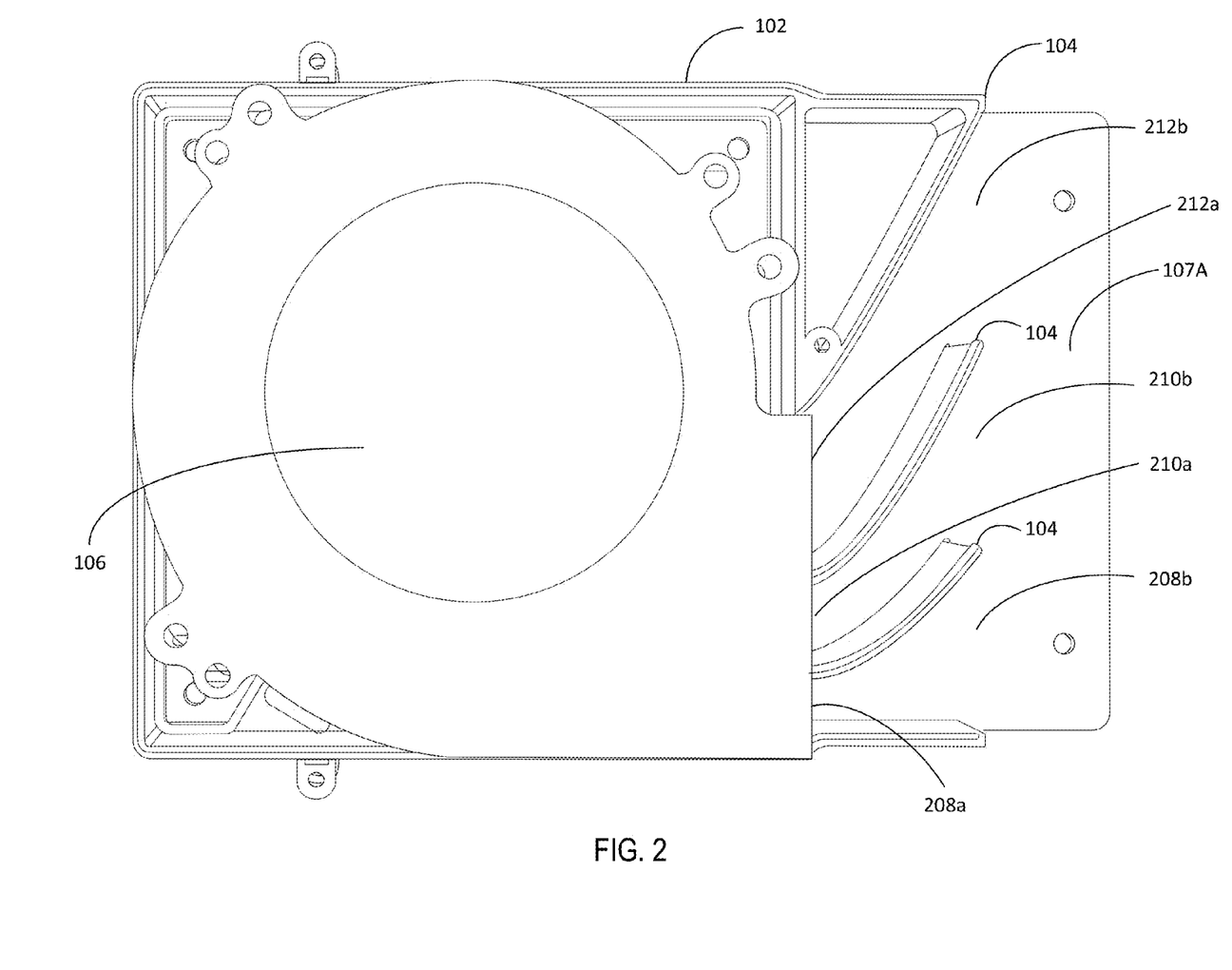
FIG. 2 illustrates a bottom view of a side-discharge blower fan unit, according to certain embodiments.

FIG. 2 illustrates a bottom view of a side-discharge blower fan unit, according to certain embodiments. FIG. 2 shows blower fan unit 102 with an air intake 106 through which air can be pulled into the blower fan unit's ductwork. FIG. 2 also shows ductwork fins 104 at the air discharge portion of the blower fan unit 102. Ductwork fins 104 are positioned in a manner such that the set of fins 104 form three ductwork inlet regions (208a, 210a, 212a) and three corresponding ductwork outlet regions (208b, 210b, 212b). In other words, the ductwork fins 104 and the top lip 107a and bottom lip 107b (not shown in FIG. 2 but shown in FIG. 1) form a set of air ducts. Thus, when a radiator is connected to the blower fan unit, the set of air ducts channel air into the radiator (for example, FIG. 4, FIG. 5, FIG. 6 and FIG. 7 show the position of the radiator relative to the blower fan unit). The ductwork inlet region 208a is smaller than the ductwork inlet region 210a, which in turn is smaller than the ductwork inlet region 212a. The size ratio of the first ductwork 208a inlet region to the second ductwork inlet region 210a to the third ductwork inlet region 212a is approximately in the range of 1.0:1.35:2.7 to 1.0:1.65:3.3, according to certain embodiments. According to certain embodiments, the size ratio of the first ductwork outlet region 208b to the second ductwork outlet region 210b to the third ductwork outlet region 212b is approximately in the range of 1.0:1.0:1.0 to 1.0:1.11:1.25.

According to certain embodiments, ductwork inlet region 208a is located at a high air output flow rate region ("first air output flow rate") of the blower fan unit. At ductwork inlet region 210a, the air output flow rate region ("second air output flow rate") is lower than the first air output flow rate. At ductwork inlet region 212a, the air output flow rate region ("third air output flow rate") is lower than the second air output flow rate. For example, with no ductwork fins, the ratio of air output flow rate of the first, second and third discharge regions is approximately 480:250:180.

Thus, by including ductwork fins 104 in blower fan unit 102 allows for substantially uniform flow of air through the radiator and also results in larger bulk total airflow through the radiator than would a blower fan unit that does not have such ductwork fins 104. The air that is discharged through the ductwork outlet regions (208b, 210b, 212b) flows into a radiator such that the airflow helps cool hot liquid from a closed loop liquid cooler that is cooling a CPU or GPU on the motherboard 110. The blower fan unit, the radiator and closed loop liquid cooler comprises a cooling system as described in greater detail herein.

Figure 3:
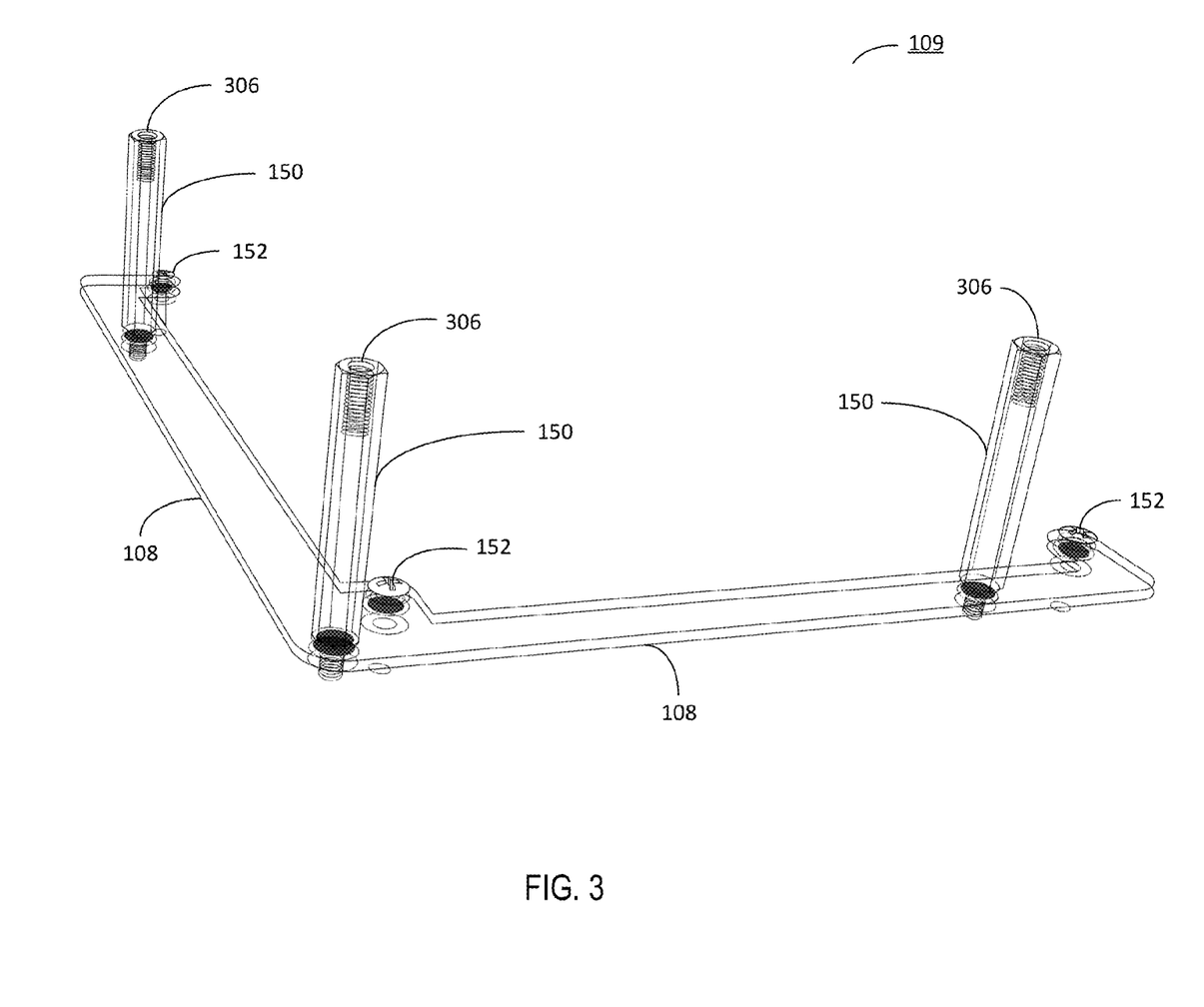
FIG. 3 illustrates a mounting system for mounting a side-discharge blower fan unit to a motherboard, according to certain embodiments.

FIG. 3 illustrates a mounting system for mounting a side-discharge blower fan unit to a motherboard, according to certain embodiments. FIG. 3 shows that mounting system 109 includes a base frame 108, a set of struts 150, and a system of fasteners 152. The set of struts 150 are for attaching base frame 108 to the blower fan unit (not shown in FIG. 3) via screw holes 306, according to certain embodiments. The system of fasteners 152 are for fastening base frame 108 to the motherboard that is installed in the PC chassis. According to certain embodiments, the system of fasteners 152 are designed and positioned to fit in standard mounting positions on the motherboard, thus making mounting system 109 compatible with a variety of motherboards. Such a mounting system allows the blower fan unit to be mounted directly over the motherboard such that the blower fan unit is at a small distance (approximately in the range of 40 millimeters to 50 millimeters) over the motherboard. According to certain embodiments, the blower fan unit is mounted at distance of approximately 45 millimeters above the motherboard.

Figure 4:
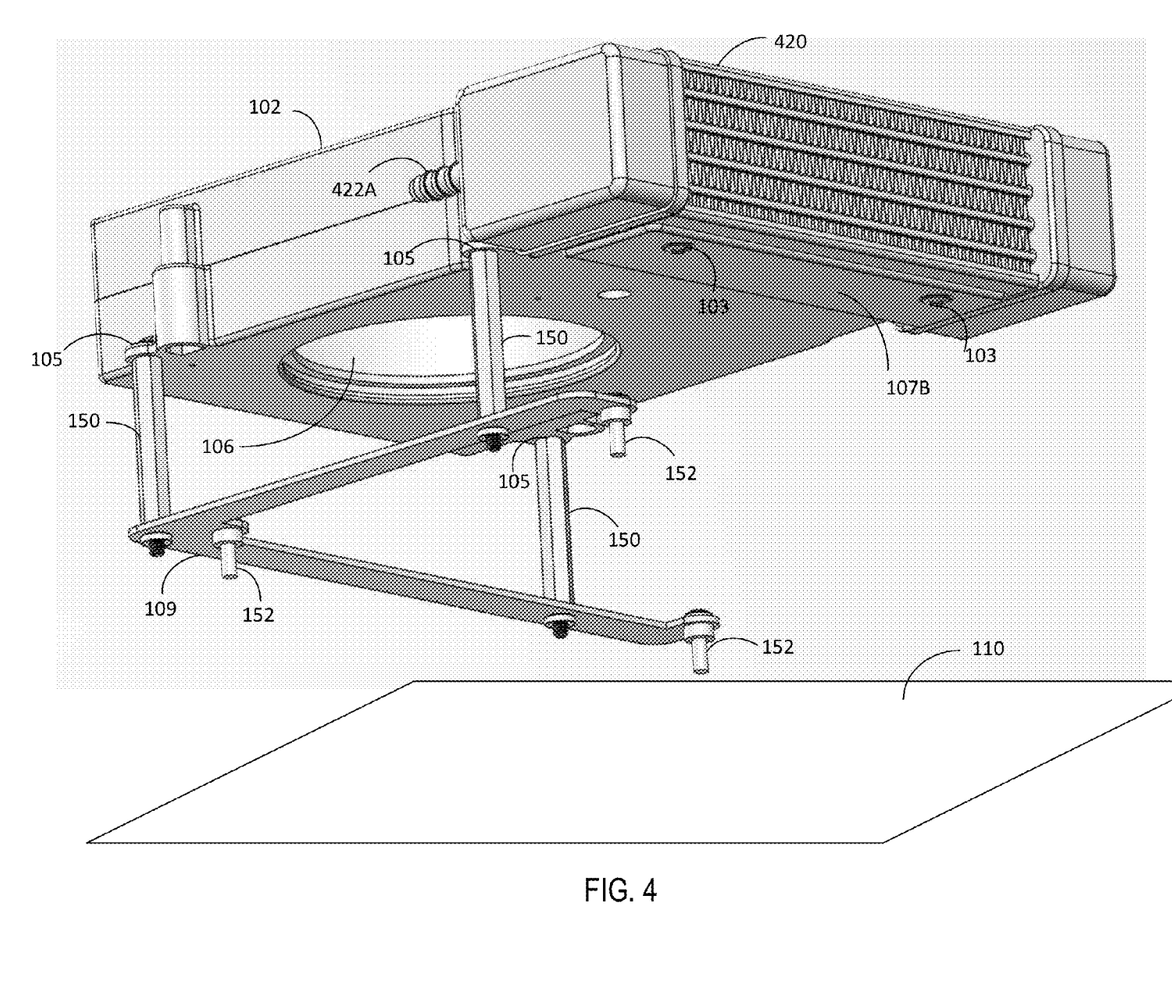
FIG. 4 illustrates the blower fan unit in relation to a radiator, according to certain embodiments.

FIG. 4 illustrates the blower fan unit in relation to a radiator, according to certain embodiments. FIG. 4 shows blower fan unit 102 that is attached to a radiator 420 using an attachment system (e.g., screw holes and associated screws) 103 on lower lip 107b and upper lip 107a (upper lip 107a is not shown in FIG. 4 but is shown in at least FIG. 1, FIG. 5, FIG. 6 and FIG. 7) such that the air discharged from blower fan unit 102 can help radiator 420 remove heat from the hot liquid from a CPU/GPU closed loop liquid cooler as described herein with reference with FIG. 2, FIG. 5, FIG. 7 and FIG. 8. Radiator 420 has an inlet tube and an outlet tube (only inlet tube 422A is shown in FIG. 4) for attaching to the CPU/GPU closed loop liquid cooler. Mounting system 109 includes mounting struts 150 (that fit mounting holes 105 on the blower fan unit 102).

Figure 5:
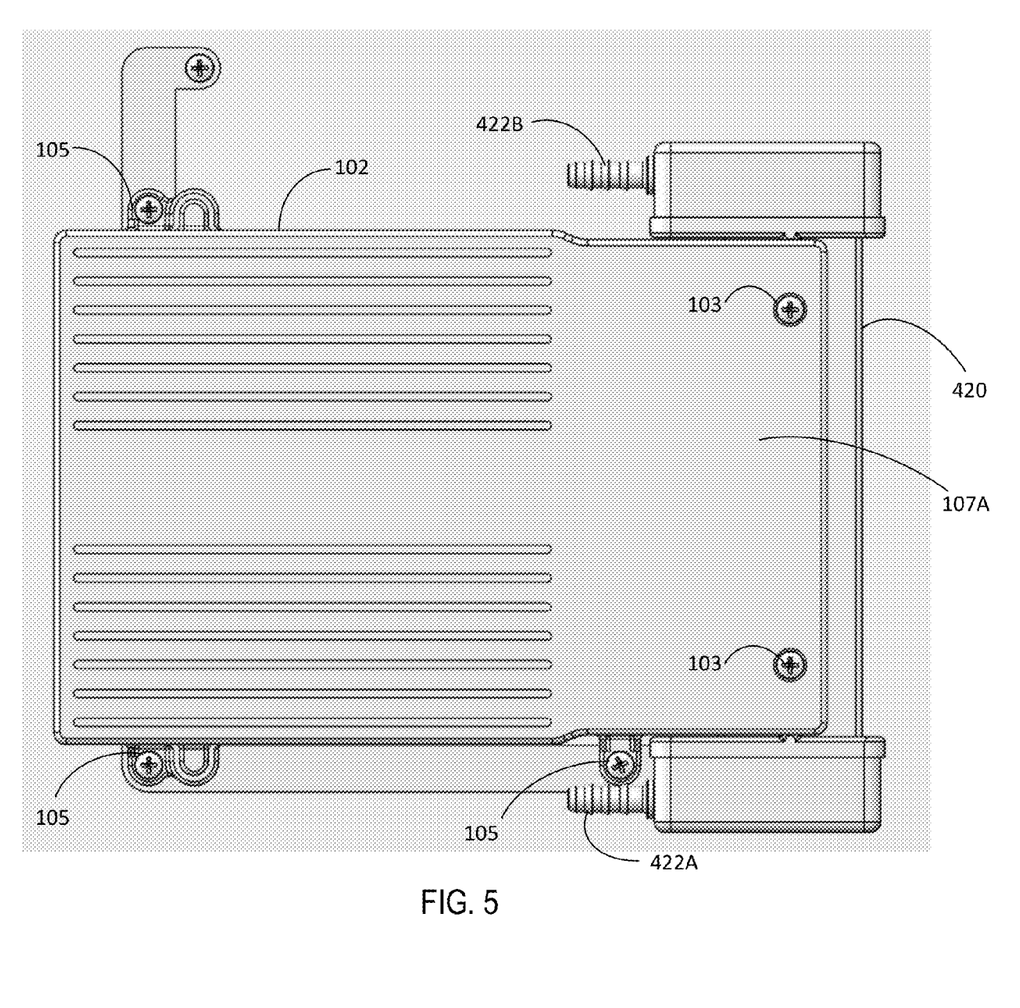
FIG. 5 illustrates a top view of the blower fan unit in connection with a radiator, according to certain embodiments.

FIG. 5 illustrates a top view of blower fan unit 102 and radiator 420. FIG. 5 shows inlet tube 422A and outlet tube 422B of radiator 420. Inlet tube 422A receives hot liquid from a CPU/GPU closed loop liquid cooler and the hot liquid is passed through the active cooling area of radiator 420. The radiator 420, with the help of relatively cool air from the blower fan unit 102, removes heat from the hot liquid, and the liquid exits radiator 420 through outlet tube 422B and returned to the CPU/GPU closed loop liquid cooler. Blower fan unit 102 is attached to radiator 420 using an attachment system (e.g., screw holes and associated screws) 103 on upper lip 107a and bottom lip 107b (bottom lip 107b is not shown in FIG. 5 but is shown in at least FIG. 1, FIG. 4 and FIG. 6). Mounting holes 105 on the blower fan unit 102 fit mounting struts 150 of mounting system 109 as described herein with reference to the figures herein.

Figure 6:
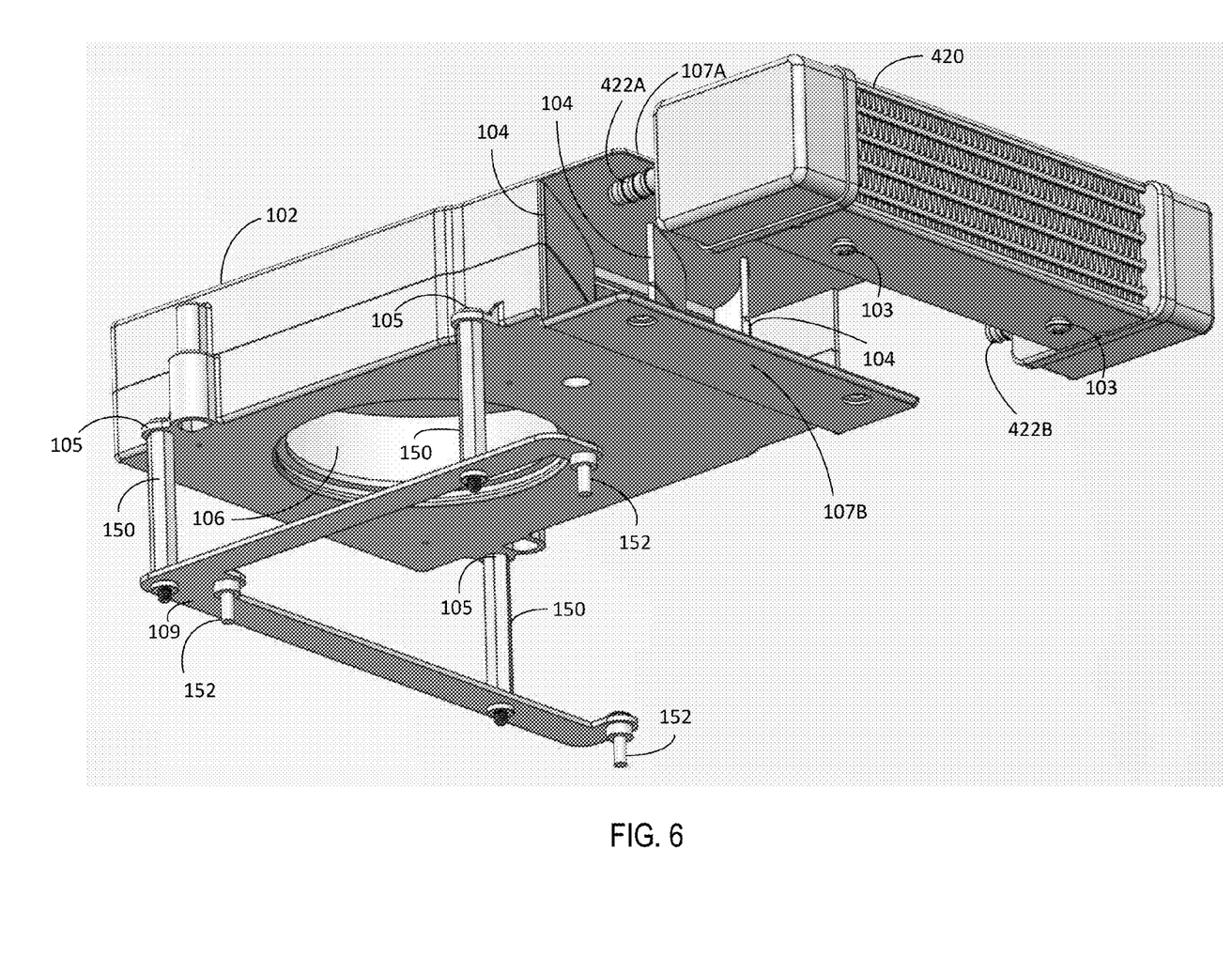
FIG. 6 illustrates the blower fan unit separated from the radiator, according to certain embodiments.

FIG. 6 illustrates the unit blower separated from the radiator. FIG. 6 shows the fins 104 of the blower unit's (102) ductwork in relation to radiator 420 so as to illustrate how the relatively cool air that is discharged from side-discharge blower fan unit 102 is directed by fins 104 over the heat transfer area of radiator 420 when radiator 420 is attached to blower fan unit 102 and when the blower fan unit 102 is running. Inlet tube 422A receives hot liquid from a CPU/GPU closed loop liquid cooler. Heat is transferred from the hot liquid as the liquid is passed through the active cooling area of radiator 420 and exits radiator 420 through outlet tube 422B. Blower fan unit 102 also includes an attachment system 103 (e.g., screw holes and associated screws) on upper lip 107a and bottom lip 107b for attaching the blower fan unit 102 to radiator 420. Mounting holes 105 on the blower fan unit 102 fit mounting struts 150 of mounting system 109 as described herein with reference to the figures herein.

Figure 7:
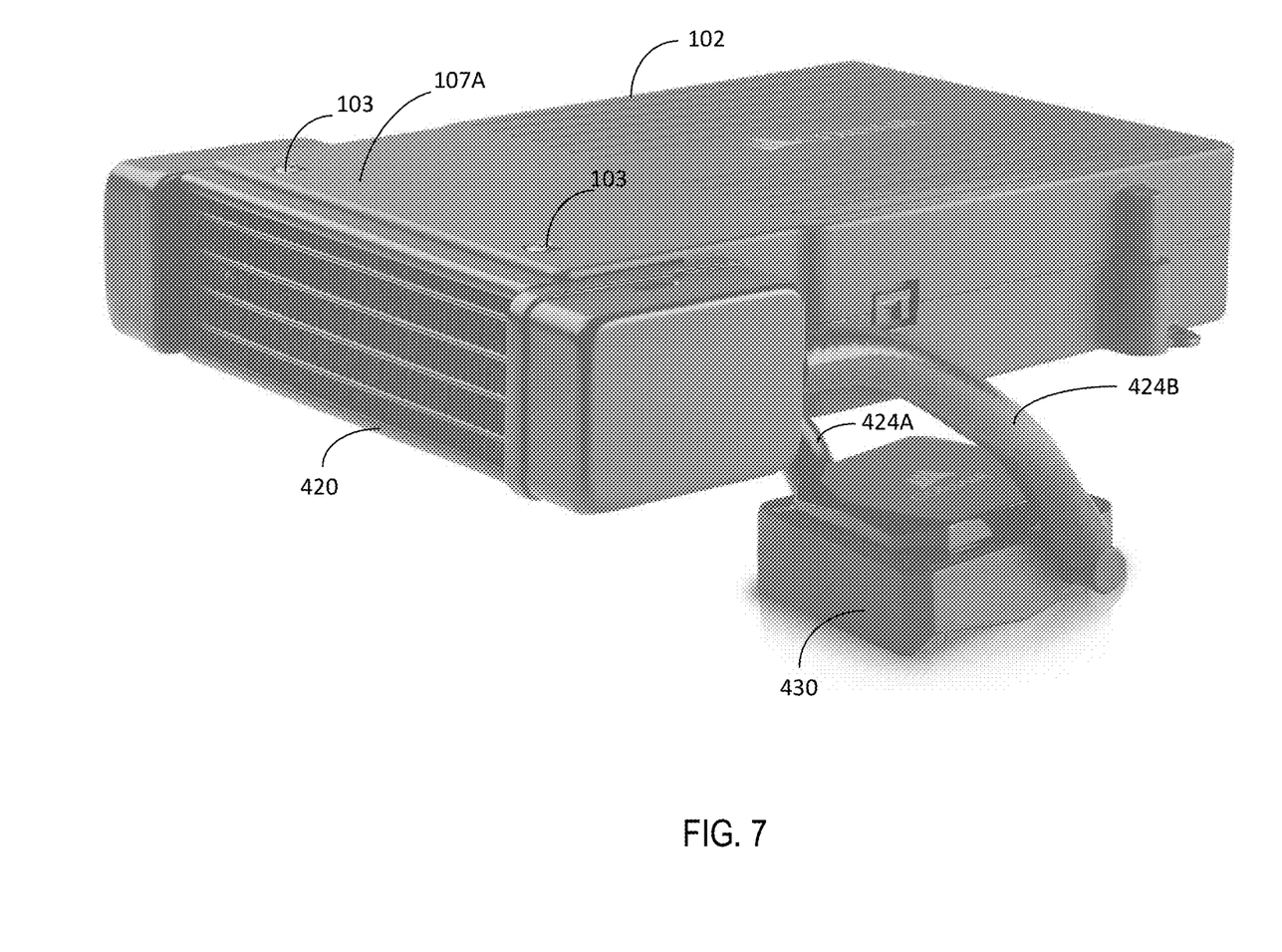
FIG. 7 illustrates the blower fan unit in relation to a CPU/GPU closed loop liquid cooler, according to certain embodiments.

FIG. 7 illustrates the unit blower fan in relation to a CPU/GPU closed loop liquid cooler. FIG. 7 shows CPU/GPU closed loop liquid cooler 430 that has an outlet tube 424A. Outlet tube 424A carries hot liquid that exits CPU/GPU closed loop liquid cooler 430 to enter radiator 420 through the radiator's inlet tube as described above. Heat is removed from the hot liquid as the liquid is passed through radiator 420 and exits radiator 420 through the radiator's outlet tube. The outlet tube of radiator 420 is connected to inlet tube 424B of CPU/GPU closed loop liquid cooler 430. Inlet tube 424B carries cool liquid from radiator 420 to CPU/GPU closed loop liquid cooler 430, which is turn removes heat from the CPU as described in further detail with reference with FIG. 8 herein.

Figure 8:
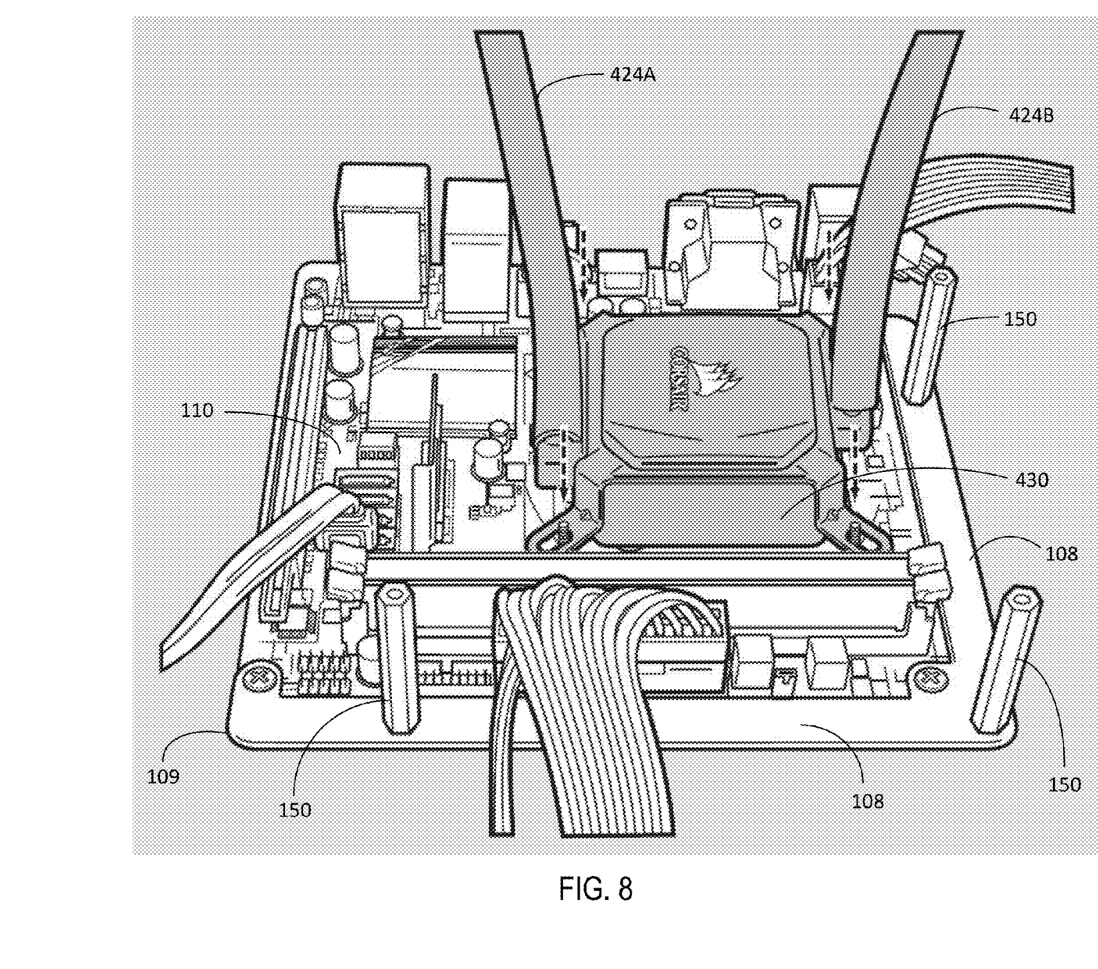
FIG. 8 illustrates the CPU/GPU closed loop liquid cooler in relation to the motherboard, according to certain embodiments.

FIG. 8 illustrates the CPU/GPU closed loop liquid cooler in relation to the motherboard. FIG. 8 shows CPU/GPU closed loop liquid cooler 430 installed over a CPU (the CPU is not visible in FIG. 8) on motherboard 110. FIG. 8 also shows mounting frame 109 mounted on motherboard 110. Struts 150 of mounting frame 109 are for supporting the blower fan unit with radiator (not shown in FIG. 8) in a position directly over the motherboard 110 and CPU/GPU closed loop liquid cooler 430, as previously described herein. Cool liquid exiting from the radiator is carried by tube 424B to a heat transfer mechanism in CPU/GPU closed loop liquid cooler 430 that removes heat from the CPU (or GPU, as the case may be) on motherboard 110. For example, CPU/GPU closed loop liquid cooler 430 includes a cold plate. One side of the cold plate is in contact with the CPU (or GPU) on the motherboard. The other side of the cold plate is in contact with cool liquid transported from the radiator through tube 424B. The cold plate removes heat from the CPU (or GPU) and the cool liquid flowing over the other side of the cold plate, in turn, removes the heat from the cold plate. The closed loop liquid cooler includes a water pump. The water pump moves the heated liquid, via tube 424A, to the radiator for heat removal. Similarly, the pump circulation returns the cool liquid from the radiator back to the cold plate.

According to certain embodiments, a blower fan unit comprises: a top surface; a bottom surface, wherein the bottom surface faces a motherboard when the blower fan unit is installed over the motherboard and the bottom surface includes an air intake; and a ductwork system comprising a set of N fins arranged at an air discharge region of the blower fan unit, wherein the set of N fins divide the air discharge region into N air ducts and N is a positive integer greater than 1. The N fins are positioned in the blower fan unit to form a set of N air ducts such that the total air flow pressure at each of the N inlets of the N air ducts is approximately equal to one another, and the N fins are shaped in a manner such that the outlets of the N air ducts are of approximately equal area.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

We claim:

1. A blower fan unit comprising:
   a top surface;
   a bottom surface, wherein the bottom surface faces a motherboard when the blower fan unit is installed over the motherboard and the bottom surface includes an air intake; and
   a ductwork system comprising a set of fins arranged at an air discharge region of the blower fan unit, wherein the set of fins divide the air discharge region into at least three air ducts; wherein
   a first air duct of the at least three air ducts comprises a first inlet and a first outlet;
   a second air duct of the at least three air ducts comprises a second inlet and a second outlet;
   a third air duct of the at least three air ducts comprises a third inlet and a third outlet;
   a first-to-second inlet size ratio of the first inlet to the second inlet is in a first inlet range of 1.0:1.35 to 1.0:1.65;
   a first-to-third inlet size ratio of the first inlet to the third inlet is in a second inlet range of 1.0:2.7 to 1.0:3.3;
   a first-to-second outlet size ratio of the first outlet to the second outlet is in a first outlet range of 1.0:1.0 to 1.0:1.11; and
   a first-to third outlet size ratio of the first outlet to the third outlet is in a second outlet range of 1.0:1.0 to 1.0:1.25.

2. The blower fan unit of claim 1, further comprises mounting holes for connecting to a plurality of struts of a mounting system to mount the blower fan unit to the motherboard such that the blower fan unit is located directly over the motherboard.

3. The blower fan unit of claim 2, wherein each strut of the plurality of struts has a length of substantially 45 millimeters to raise the blower fan unit over the motherboard.

4. The blower fan unit of claim 2, wherein each strut of the plurality of struts has a length in a range of 40 millimeters to 50 millimeters to raise the blower fan unit over the motherboard.

5. The blower fan unit of claim 1, further comprises an attachment system for attaching the blower fan unit to a radiator.

6. The blower fan unit of claim 5, wherein the radiator is associated with a closed loop liquid cooler for cooling a CPU or a GPU associated with the motherboard.

* * * * *